US011689634B2

(12) United States Patent
Stein et al.

(10) Patent No.: US 11,689,634 B2
(45) Date of Patent: Jun. 27, 2023

(54) OPTIMIZING SIZE OF PROTOCOL COMMUNICATION IN A VEHICLE INTERNAL NETWORKS

(71) Applicant: Saferide Technologies Ltd., Tel-Aviv (IL)

(72) Inventors: Yehiel Stein, Ramat HaSharon (IL); Yossi Vardi, Tel-Aviv (IL)

(73) Assignee: Saferide Technologies Ltd., Tel-Aviv (IL)

(*) Notice: Subject to any disclaimer, the term of this patent is extended or adjusted under 35 U.S.C. 154(b) by 0 days.

(21) Appl. No.: 17/257,901

(22) PCT Filed: Jul. 9, 2019

(86) PCT No.: PCT/IL2019/050765
§ 371 (c)(1),
(2) Date: Jan. 5, 2021

(87) PCT Pub. No.: WO2020/012471
PCT Pub. Date: Jan. 16, 2020

(65) Prior Publication Data
US 2021/0274010 A1    Sep. 2, 2021

Related U.S. Application Data

(60) Provisional application No. 62/695,209, filed on Jul. 9, 2018.

(51) Int. Cl.
*H04L 67/5651* (2022.01)
*G06N 20/00* (2019.01)
*H04L 12/40* (2006.01)

(52) U.S. Cl.
CPC ......... *H04L 67/5651* (2022.05); *G06N 20/00* (2019.01); *H04L 12/40032* (2013.01); *H04L 2012/40273* (2013.01)

(58) Field of Classification Search
CPC ..... H04L 41/22; H04L 41/142; H04L 41/026; H04L 41/0816; H04L 63/1425;
(Continued)

(56) References Cited

U.S. PATENT DOCUMENTS 8,483,230 B1    7/2013 Zhang et al.
8,718,797 B1 *  5/2014 Addepalli ............. H04W 40/02
                                                          700/83
(Continued)

FOREIGN PATENT DOCUMENTS

WO    WO 2020/012471    1/2020

OTHER PUBLICATIONS

International Preliminary Report on Patentability dated Jan. 21, 2021 From the International Bureau of WIPO Re. Application No. PCT/IL2019/050765. (7 Pages).
(Continued)

*Primary Examiner* — Umar Cheema
*Assistant Examiner* — John Fan

(57) ABSTRACT

A computer implemented method of reducing a size of a message intercepted on a communication channel of a vehicle, comprising using one or more processors of a vehicular device. The processor(s) is adapted for receiving one or more of a plurality of messages intercepted by one or more devices adapted to monitor messages transmitted via one or more segments of one or more communication channels of a vehicle, applying one or more trained machine learning models to identify one or more of a plurality of data patterns in one or more of the messages, adjusting one or more of the messages by replacing each of the identified data pattern(s) with a respective predefined lossless representation having a reduced size compared to the identified data pattern and transmitting the adjusted message(s) to a remote system via one or more upload communication channels.

11 Claims, 3 Drawing Sheets

(58) Field of Classification Search
CPC ..... H04L 51/08; H04L 41/069; H04L 63/083; H04L 67/02; H04L 69/04; H04L 41/28; H04L 63/10; H04L 41/06; H04L 41/0886; H04L 43/0817; H04L 41/0681; G06F 3/1454; G06F 3/04845; G06F 3/0485
USPC ...................................................... 709/247
See application file for complete search history.

(56) References Cited

U.S. PATENT DOCUMENTS

| | | | |
|---|---|---|---|
| 9,204,353 | B2 | 12/2015 | Hsu et al. |
| 9,277,370 | B2 | 3/2016 | Addepalli et al. |
| 9,843,594 | B1 * | 12/2017 | Evans ................. H04L 63/1425 |
| 10,593,109 | B1 * | 3/2020 | Floyd ................... G05D 1/0094 |
| 2014/0215491 | A1 | 7/2014 | Addepalli et al. |
| 2019/0295003 | A1 * | 9/2019 | Dronen ................ G05D 1/0221 |
| 2020/0177418 | A1 * | 6/2020 | Hoydis ................ G06N 3/0454 |

OTHER PUBLICATIONS

International Search Report and the Written Opinion dated Jun. 4, 2020 From the International Searching Authority Re. Application No. PCT/IL2019/050765. (13 Pages).

Supplementary European Search Report and the European Search Opinion dated Feb. 1, 2022 From the European Patent Office Re. Application No. 19835206.4. (9 Pages).

* cited by examiner

OPTIMIZING SIZE OF PROTOCOL COMMUNICATION IN A VEHICLE INTERNAL NETWORKS

RELATED APPLICATIONS

This application is a National Phase of PCT Patent Application No. PCT/IL2019/050765 having International filing date of Jul. 9, 2019, which claims the benefit of priority under 35 USC § 119(e) of U.S. Provisional Patent Application No. 62/695,209 filed on Jul. 9, 2018. The contents of the above applications are all incorporated by reference as if fully set forth herein in their entirety.

FIELD AND BACKGROUND OF THE INVENTION

The present invention, in some embodiments thereof, relates to reducing size of messages intercepted in an operational environment of a vehicle, and, more specifically, but not exclusively, to reducing size of messages intercepted in an operational environment of a vehicle by optimizing learned data patterns identified in the messages.

The operation of vehicles, for example, ground vehicles (e.g. cars, trucks, motorcycles, trains, etc.), aerial vehicles (e.g. drones), naval vehicles (e.g. unmanned naval vehicles), robots and/or the like has long ago become heavily reliant on automated systems utilizing multiple Electronic Control Units (ECU) deployed in the vehicle to control almost every aspect of the operation of the vehicle. This trend is naturally further intensifies with the evolution of autonomic vehicles where the human factor, i.e. the human driver, is no longer the sole controller of the vehicle which is rather controlled at least partially by the automated and autonomous systems.

The automated and autonomous systems of the vehicle may utilize for their operation a plurality of devices deployed in the vehicle, for example, sensors, Electronic Control Units (ECU), Input/Output (I/O) controllers, communication controllers and/or the like. The plurality of deployed devices may communicate with each by exchanging messages over one or more communication channels deployed in the vehicle, for example, a Controller Area Network (CAN) bus, a Local Interconnect Network (LIN), a FlexRay bus, a Local area Network (LAN), an Ethernet, an automotive Ethernet, a wireless LAN (WLAN, e.g. Wi-Fi), a Wireless CAN (WCAN), a Media Oriented Systems Transport (MOST) and/or the like.

These automated and autonomous systems may transfer large volumes of data, for example, the exchanged messages and/or part thereof to remote (off vehicle) networked resources, for example, remote servers, cloud services and/or the like for a plurality of uses and applications such as, for example, predictive maintenance, anomaly detection, forensics, fleet management and many others.

SUMMARY OF INVENTION

According to a first aspect of the present invention there is provided a computer implemented method of reducing a size of a message intercepted on a communication channel of a vehicle, comprising using one or more processors of a vehicular device, the processor(s) is adapted for:

Receiving one or more of a plurality of messages intercepted by one or more devices adapted to monitor messages transmitted via one or more segments of one or more communication channels of a vehicle.

Applying one or more trained machine learning models to identify one or more of a plurality of data patterns in one or more of the messages.

Adjusting one or more of the messages by replacing each of the identified data pattern(s) with a respective predefined lossless representation having a reduced size compared to the identified data pattern.

Transmitting the adjusted message(s) to a remote system via one or more upload communication channels.

According to a second aspect of the present invention there is provided a system for reducing a size of a message intercepted on a communication channel of a vehicle, comprising:

A program store storing a code; and

One or more processors of a vehicular device coupled to the program store for executing the stored code. The code comprising:

Code instructions to receive one or more of a plurality of messages intercepted by one or more devices adapted to monitor messages transmitted via one or more segments of one or more communication channels of a vehicle.

Code instructions to apply one or more trained machine learning models to identify one or more of a plurality of data patterns in one or more of the messages.

Code instructions to adjust one or more of the messages by replacing each of the identified data pattern(s) with a respective predefined lossless representation having a reduced size compared to the identified data pattern.

Code instructions to transmit the adjusted message(s) to a remote system via one or more upload communication channels.

Reducing the size of the intercepted messages may significantly reduce communication resources, for example, a bandwidth available for transmitting (uploading) data, specifically the intercepted messages from the vehicle to the remote networked resource(s), in particular since the communication resources available to the vehicle may be significantly limited. In addition, in case the intercepted messages are locally stored in the vehicle for further analysis at the vehicle and/or for uploading (transmitting) them to the remote networked resource(s) at a later time, storing the reduced size messages may require significantly reduced storage resources in the vehicle. Moreover, since huge numbers of vehicles may be uploading their intercepted messages to the remote networked resource(s), the storage resources required at the remote networked resource(s) for storing the reduced size messages received from the plurality of vehicles may be significantly reduced. Furthermore, using the machine leaning model(s) for the pattern detection may be highly superior compared to rule based implementations since the machine leaning model(s) may automatically and constantly evolve to adapt to new message content patterns while avoiding the need to redesign and deploy updated pattern detection rules. The machine leaning model(s) may be trained using large volumes of realistic training datasets thus significantly improving the accuracy, efficiency and/or comprehensiveness of the pattern detection.

In an optional implementation form of the first and/or second aspects, one or more of the devices are adapted to monitor the transmitted messages is a receiver-only device incapable of altering transmission signals of the segment(s) of the communication channel(s). This may prevent affecting the transmission signals on the communication channel(s) thus reducing the potential for a failed, compromised and/or malicious monitoring device(s) to affect and possibly jeopardize the operation of the communication channel(s).

In a further implementation form of the first and/or second aspects, each of the data patterns is a member of a group consisting of: a constant value, an incrementing value, a decrementing value and a finite range of discrete values. The ability to detect a wide range of data patterns in the intercepted messages may allow efficient reduction of the message size.

In a further implementation form of the first and/or second aspects, the machine learning model(s) is trained with a plurality of training messages to identify one or more of the data patterns in one or more fields of one or more of the messages. Each of the fields is a member of a group consisting of: a message identifier, an originating device identifier, a destination device identifier, a time stamp, a payload size indicator, a payload, a metadata and a protocol related field. Most communication protocols consist of messages having predefined fields. Configuring and training the machine learning model(s) to identify these fields may therefore allow efficient detection of the data patterns in the intercepted messages.

In a further implementation form of the first and/or second aspects, one or more of the machine learning models are trained to identify the data pattern(s) in one or more portions of the payload. Some communication protocols may consist of payloads containing multiple individual and separate data items each relating to a different aspect addressed by the message. Configuring and training the machine learning model(s) to identify these individual and separate data items may therefore allow efficient detection of the data patterns in the intercepted messages.

In a further implementation form of the first and/or second aspects, the respective predefined representation comprises a reduced size value corresponding to the identified data pattern. Representing the data pattern with a significantly smaller size value may significantly reduce the overall size of the intercepted message.

In a further implementation form of the first and/or second aspects, the reduced size value is an index mapping each of identified data pattern(s) in a dataset associating between each of the plurality of data patterns and a respective reduced size value. Mapping predefined reduced size values in the dataset (e.g. table, list, database, etc.) may allow the remote networked resource(s) receiving the reduced size message(s) to easily and efficiently recover the data pattern(s) replaced with the reduced size value(s) to reconstruct an original message from a respective reduced size mes sage.

In a further implementation form of the first and/or second aspects, the reduced size value is an adjusted field corresponding to a data pattern of one of a plurality of fields identified in one or more of the messages. Each of the plurality of fields is a member of a group consisting of: a message identifier, an originating device identifier, a destination device identifier, a time stamp, a payload size indicator, a payload, a metadata and a protocol related field. Since most communication protocols consist of messages having predefined fields replacing the data patterns with reduced size values corresponding to the message fields may allow for significant reduction and/or compression of the field data patterns thus significantly reducing the overall size of the intercepted message.

In a further implementation form of the first and/or second aspects, the reduced size value corresponding to a data pattern identified in at least a portion of the payload. Since many communication protocols define multiple individual and separate data items in the payload of at least some message, replacing the data patterns with reduced size values corresponding to the data items may allow for significant reduction and/or compression of the field data patterns thus significantly reducing the overall size of the intercepted message.

In an optional implementation form of the first and/or second aspects, one or more of the data patterns are discarded. The discarded data pattern(s) corresponding to the protocol related field identified in one or more of the messages. Many communication protocols consist of messages having protocol related fields, bits and/or the like which are used for control the message flow. Such protocol related fields, bits, etc. may have little value during analysis of the intercepted messages since the analysis may be directed to a higher level of operational behavior of the vehicle. Identified data patterns corresponding to such protocol related fields, bits, etc. may therefore be removed in order to further reduce the size of the adjusted message(s).

In an optional implementation form of the first and/or second aspects, the reduced size value is an adjusted time stamp corresponding to a time stamp data pattern of one or more of the messages indicating a timing of transmission of the respective message via the segment(s). The adjusted time stamp is adjusted according to a transmission time of the respective message. Every message travelling over the internal communication channel(s) of the vehicle may be associated with a travel time which is the time required for the message to reach its destination device. While some of the intercepted messages may contain a high resolution time stamp, the high resolution timing may provide little value due to the significantly slower travel (transmission) time. Therefore replacing the high resolution time stamp with a smaller size time stamp indicating the timing in a lower resolution corresponding to the transmission time may not affect the timing information while it may significantly reduce the time stamp size and hence the size of the entire adjusted mes sage.

In an optional implementation form of the first and/or second aspects, the reduced size value is an adjusted time stamp corresponding to a time stamp data pattern of one or more of the messages indicating a timing of transmission of the one or more message The adjusted time stamp is adjusted to include a relative timing compared to one or more previous messages. Assigning timing information (time stamp) to at least some of the intercepted messages which is relative to the timing of other messages, specifically previously intercepted messages may allow discarding the high resolution time stamp some of these intercepted messages may include thus significantly reducing the time stamp size and hence the size of the entire adjusted message.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE SEVERAL VIEWS OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings.

DETAILED DESCRIPTION OF SPECIFIC EMBODIMENTS OF THE DISCLOSURE

Figure 1:
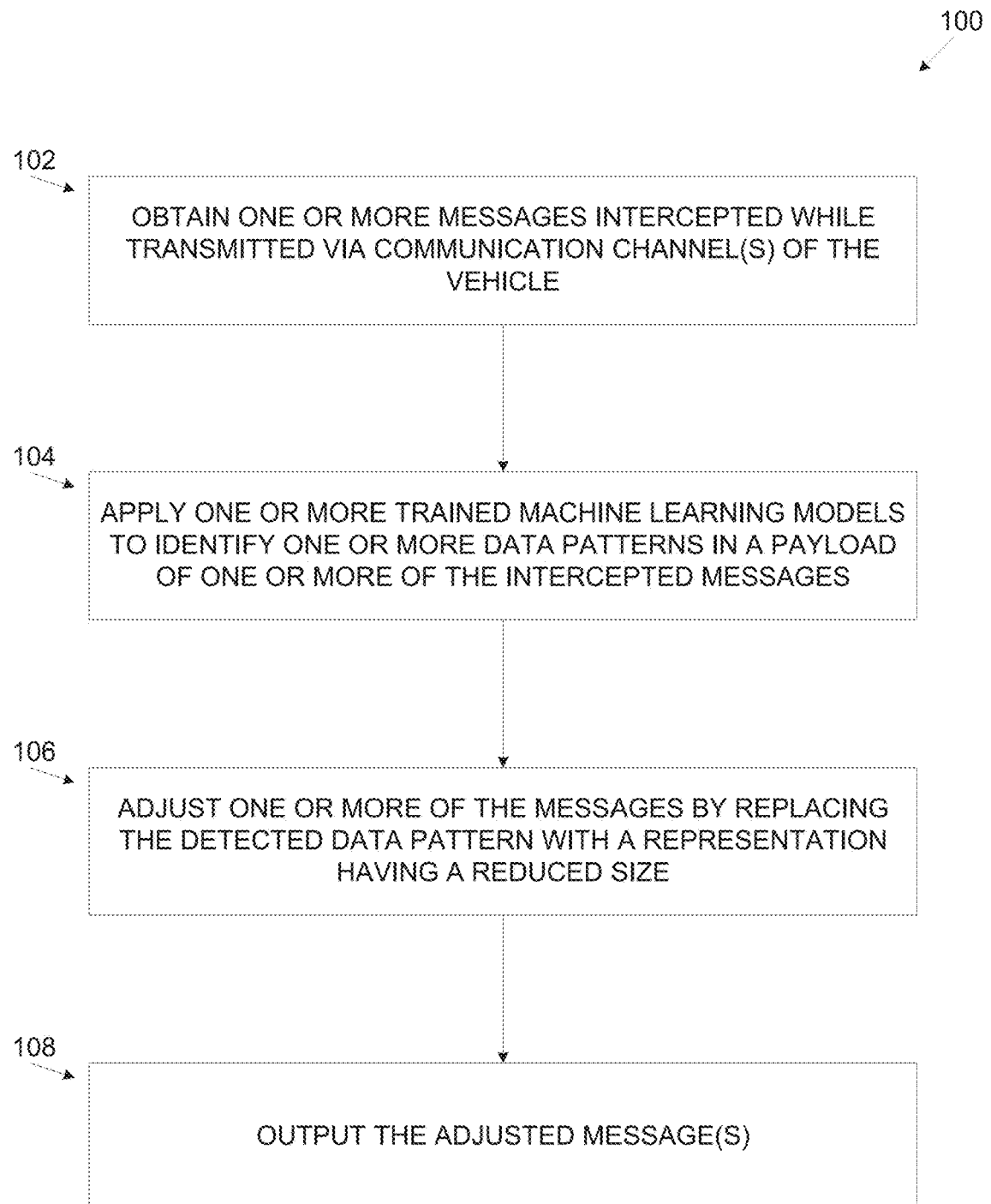
FIG. 1 is a flowchart of an exemplary process of reducing a size of intercepted messages, according to some embodiments of the present invention.

The present invention, in some embodiments thereof, relates to reducing size of messages intercepted in an operational environment of a vehicle, and, more specifically, but not exclusively, to reducing size of messages intercepted in an operational environment of a vehicle by optimizing learned data patterns identified in the messages.

According to some embodiments of the present invention, there are provided methods and systems for reducing a size of one or more messages intercepted while transmitted via one or more communication channels of a vehicle, for example, a ground vehicle, an aerial vehicle, a naval vehicle, a robot and/or the like. The reduced size messages may be typically be transmitted from the vehicle to one or more remote (off vehicle) networked resources, for example, a remote server, a cloud service, a cloud platform and/or the like which may further analyze the intercepted messages for one or more applications, for example, predictive maintenance, anomaly detection, forensics, fleet management and many others. Additionally or alternatively, the reduced size messages may be locally stored at the vehicle in order to locally analyze them and/or upload them at a later time to the remote networked resource(s) for further analysis.

One or more monitoring devices may be deployed in the vehicle to intercept one or more messages exchanged through one or more communication channels and/or protocols used in the vehicle, for example, a CAN bus, a LIN, a FlexRay, a LAN, an Ethernet, an automotive Ethernet, a WLAN (e.g. Wi-Fi), a WCAN, a MOST and/or the like in order to communicate with one or more devices deployed in the vehicle 202, for example, a sensor, an ECU, a I/O controller, a communication controller and/or the like.

The monitoring device(s) may optionally be configured as passive receiver-only device incapable of injecting data to the communication channels. The monitoring device(s) may be coupled to the communication channel(s) in an isolated manner thus incapable of inducing, altering, manipulating and/or otherwise affecting the transmission signals of the communication channels in any way.

One or more trained machine learning model(s) may be applied to analyze one or more of the intercepted messages in order to identify one or more data patterns in the intercepted message(s). The trained machine learning models, for example, a parametric machine learning model, a non-parametric machine learning model, a supervised machine learning model, an unsupervised machine learning model, a semi-supervised machine learning model and/or the like may utilize one or more machine learning probabilistic models, engines and/or algorithms, for example, a neural network, a support vector machine (SVM), a decision tree, a K-Nearest neighbors algorithm, a context tree, a graphical model, a Bayesian net, a random forest, a rotational forest, a deep learning algorithm and/or any other learning algorithm trained as known in the art.

During the training phase the machine learning model(s) may be trained with training datasets comprising training message designed, constructed and/or selected to represent the messages exchanged in the operational environment of the (target) vehicle. The machine learning model(s) is trained to identify, i.e. cluster, classify, map and/or the like one or more data patterns in the intercepted messages. The data patterns learned by the trained machine learning model(s) during a training phase may include, for example, constant values, incrementing values, decrementing values, finite sets and/or ranges of discrete values and/or the like.

The communication channels and/or protocols utilized in the vehicle typically define messages comprising a plurality of fields, for example, a message identifier, an originating device identifier, a destination device identifier, a time stamp, a payload size indicator, a payload, a metadata, a protocol related field and/or the like. The machine learning model(s) may therefore be trained to identify the data patterns in the fields of the intercepted messages.

The intercepted messages may be adjusted by replacing the identified data patterns with respective predefined representations having a reduced size compared to the respective data patterns such that the overall size of the intercepted messages is significantly reduced. The predefined representations may typically be lossless such that no data is lost by replacing the original data pattern(s) detected in the message(s) with the predefined reduced size representation(s).

The reduced size representations may be predefined to reduce the size of certain field(s) of the intercepted message(s) according to one or more operational parameters of the vehicle, for example, a type of the devices deployed in the vehicle, a type of the protocols used in the vehicle, a communication capabilities of the vehicle and/or the like. For example, one or more of the protocols used in the vehicle may define large fields (in terms of bits and/or bytes) to allow encoding very large values, for example, message types, device identifiers, status and/or control data codes, sensor reading values and/or the like. However, the operational parameters of each vehicle may naturally include limited and significantly small value set(s) and/or range(s) for these operational parameters. The size of one or more of the fields may therefore be significantly reduced to allow encoding the set(s) and/or range(s) applicable for the vehicle.

For example, a certain protocol may define a large message identifier field to support a large number of message types. However, the number of message types actually used by the devices deployed in the vehicle may be significantly small. The message identifier may therefore be represented by a reduced size representation (having less bits or bytes) which is sufficient for encoding the small number of message types actually used in the vehicle environment. In another example, a certain protocol may define a large payload field to support a wide range of data values. However, the number of data values actually recorded in messages exchanged between the devices deployed in the vehicle may be limited and significantly small compared to the supported range.

Optionally, the reduced size representations of the detected data patterns are mapped in a dataset, for example, a list, a table, a database and/or the like comprising a plurality of entries each associating (indexing) one of the learned data patterns with a respective one of a plurality of predefined reduced size representations. The dataset is available both at the vehicle and to the remote networked resource(s) such that remote networked resource(s) may correctly decode the predefined reduced size representations to restore the respective original data patterns replaced with the predefined reduced size representations. Moreover, the reduced size representations may be indices in the dataset such that each of the reduced size representations points to its respective data pattern which may thus be easily retrieved from the dataset.

Moreover, the time stamp field identified in one or more of the intercepted messages may be very large to support absolute high resolution timing, for example, a date, a day of week, a time including fractions of time (e.g. hours, minutes, seconds, milliseconds, microseconds, nanoseconds, etc.) and/or the like. However, the transmission time of the message over the communication channel of the vehicle may relatively low. As such, the high resolution time stamp expressing, for example, microseconds and/or nanoseconds may be irrelevant and/or of no benefit due to the significantly lower transmission rate. The high resolution elements (e.g. microseconds, nanoseconds, e.g.) may therefore be discarded, removed to provide a reduced size representation of the time stamp.

Furthermore, the absolute time stamp may be replaced with a relative time stamp expressing the time stamp of a current message with respect to the time stamp of one or more previously intercepted messages. For example, the lower resolution absolute timing elements of the time stamp such as the date, day of week, the hour and/or the like may be maintained in an intercepted message once every predefined period, for example, an hour. The next higher absolute resolution timing elements of the time stamp, for example, the minutes count and/or the seconds count may be maintained in an intercepted message once a second. As such the reduced size representation of the relative time stamp adjusted for most of the intercepted messages may include only a relative timing, for example, the milliseconds with respect to the most recently transmitted message which maintains the absolute timing.

The adjusted messages may then be output, specifically stored and/or transmitted to the remote networked resource(s) to further analyze the intercepted messages. As the data patterns detected in the originally intercepted messages are predefined, for example, in the dataset, the remote networked resource(s) having access to the dataset may correlate between the replaced data patterns and their respective reduced size representations. The remote networked resource(s) may therefore be able to recover, for example, restore, reconstruct, decode, extract and/or the like the originally intercepted messages.

Reducing the size of the intercepted messages may present significant advantages and benefits. First, the communication resources, for example, a bandwidth available for transmitting (uploading) data, specifically the intercepted messages from the vehicle to the remote networked resource(s) may be significantly limited. This may lead to a reduction in the ability to upload the intercepted messages, increase latency and/or the like in particular since the amount of intercepted messages may be extremely high. Reducing the size of the intercepted message(s) may significantly reduce the bandwidth required for uploading the intercepted messages since the bandwidth required for transmitting the adjusted messages may be significantly reduced compared to the bandwidth required for transmitting the originally intercepted messages. The adjusted messages may further reduce the latency in the upload process. In addition, in case the intercepted messages are locally stored in the vehicle for further analysis at the vehicle and/or for uploading (transmitting) them to the remote networked resource(s) at a later time, storing the reduced size messages may require significantly reduced storage resources in the vehicle.

Moreover, huge numbers of vehicles may be uploading their intercepted messages to the remote networked resource(s). Storing the intercepted messages received from these vehicles may therefore require extreme storage resources. Reducing the size of the intercepted message(s) may significantly reduce the required storage resources for storing the messages intercepted at the multitude of vehicles.

Furthermore, using the machine leaning model(s) for the pattern detection may be highly superior compared to rule based implementations as may be done by existing systems and/or methods for pattern detection. In contrast to the rule based techniques, the machine leaning model(s) may automatically and constantly evolve to adapt to new message content patterns while avoiding the need to redesign and deploy updated pattern detection rules. Moreover, the machine leaning model(s) may be trained using large volumes of realistic training datasets thus significantly improving the accuracy, efficiency and/or comprehensiveness of the pattern detection.

In addition, since the reduced size representations used to replace the identified data patterns in the intercepted messages are predefined, for example, in the dataset, the remote networked resource(s) having access to the dataset may easily recover the originally intercepted messages for its further analysis.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable storage medium can be a tangible device that can retain and store instructions for use by an instruction execution device. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer Program code comprising computer readable program instructions embodied on a computer readable medium may be transmitted using any appropriate medium, including but not limited to wireless, wire line, optical fiber cable, RF, etc., or any suitable combination of the foregoing.

The program code for carrying out operations for aspects of the present invention may be written in any combination of one or more programming languages, including an object oriented programming language such as Java, Smalltalk, C++ or the like and conventional procedural programming languages, such as the "C" programming language or similar programming languages.

The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). The program code can be downloaded to respective computing/processing devices from a computer readable storage medium or to an external computer or external storage device via a network, for example, the Internet, a local area network, a wide area network and/or a wireless network.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Referring now to the drawings, FIG. 1 illustrates a flowchart of an exemplary process of reducing a size of intercepted messages, according to some embodiments of the present invention. An exemplary process 100 may be executed to reduce a size of one or more messages intercepted while transmitted via one or more communication channels of a vehicle, for example, a ground vehicle, an aerial vehicle, a naval vehicle, a robot and/or the like. One or more trained machine learning models may be applied to identify one or more data patterns in the message(s). The identified data patterns may be replaced with respective predefined representations which are reduced in size compared to the respective data patterns such that the overall size of the intercepted messages is significantly reduced. The predefined representations may typically be lossless meaning that no data is lost by replacing the original data pattern(s) identified in the message(s) with the predefined reduced size representation(s).

The trained machine learning model(s) for example, parametric supervised algorithms, non-parametric semi-supervised algorithms, non-parametric algorithms and/or the like may be trained during a training phase with training datasets comprising training message designed, constructed and/or selected to represent the messages exchanged in the vehicle operational environment.

Figure 2:
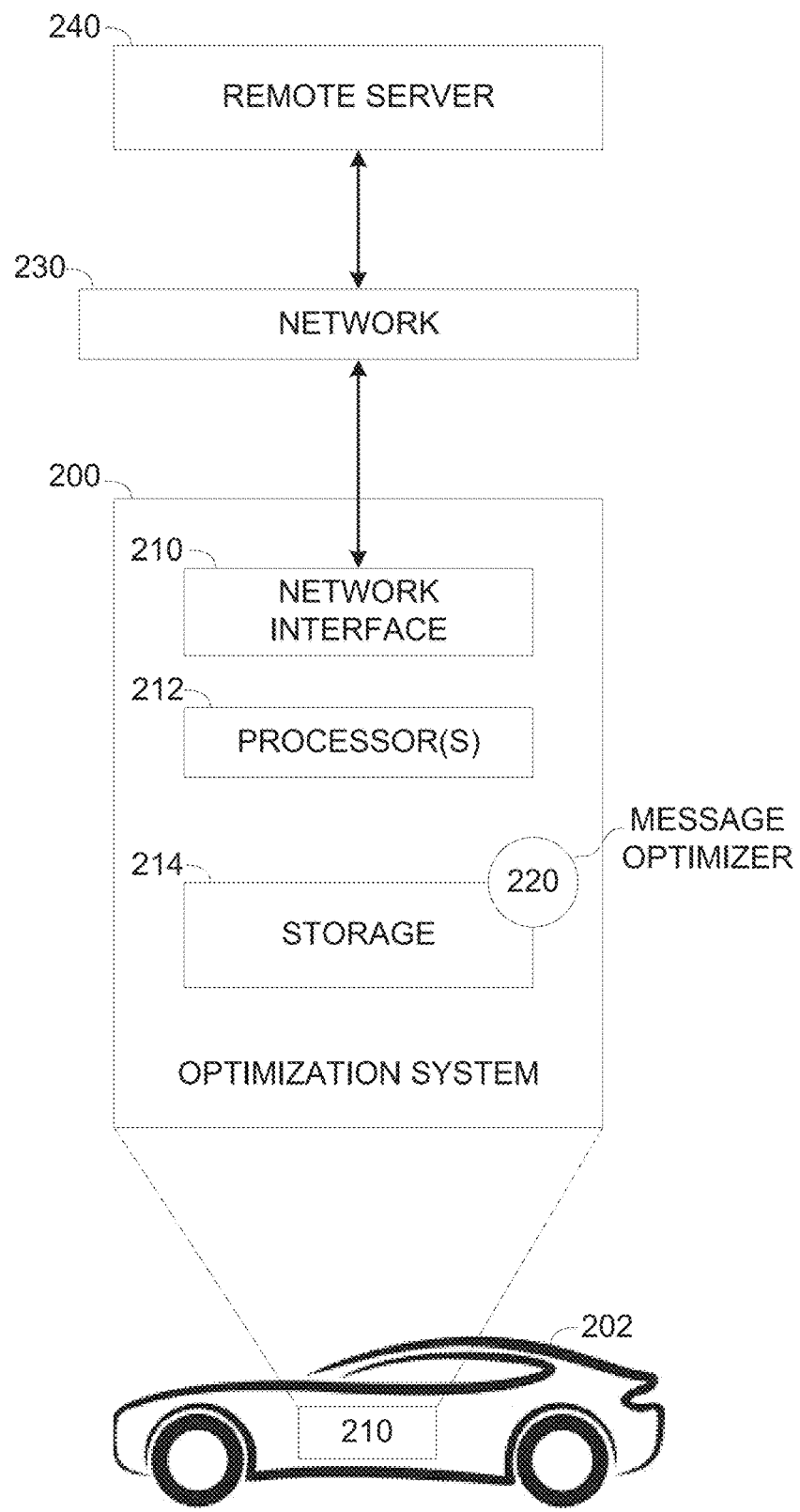
FIG. 2 is a schematic illustration of an exemplary system for reducing a size intercepted messages, according to some embodiments of the present invention.

Reference is also made to FIG. 2, which is a schematic illustration of an exemplary system for reducing a size of intercepted messages, according to some embodiments of the present invention. An exemplary optimization system 200 may be deployed, for example, installed, mounted, attached and/or integrated in a vehicle 202, for example, a ground vehicle, an aerial vehicle, a naval vehicle, a robot and/or the like in particular a ground vehicle, for example, a car, a truck, a motorcycle, a train and/or the like.

The optimization system 200 may include a network interface 210 for connecting to a network 230, a processor(s) 212 for executing a process such as the process 100 and storage 214 for storing program code (i.e. program store) and/or data. The network interface 210 may include one or more wireless network interfaces for connecting to the network 230, for example, a Radio Frequency (RF) interface, a Wireless Local Area Network (WLAN) interface, a cellular network interface and/or the like. Using the network interface 210 for connecting to a network 230 comprising one or more wired and/or wireless networks, for example, a LAN, a WLAN, a Wide Area Network (WAN), a Municipal Area Network (MAN), a cellular network, the internet and/or the like, the optimization system 200 may connect to one or more remote servers 240.

The network interface may further include one or more I/O interfaces for connecting to one or more wired and/or wireless (vehicle) communication channels of the vehicle 202, for example, a CAN bus, a LIN, a FlexRay, a LAN, an Ethernet, an automotive Ethernet, a WLAN (e.g. Wi-Fi), a WCAN, a MOST and/or the like in order to communicate with one or more devices deployed in the vehicle 202, for example, a sensor, an ECU, an I/O controller, a communication controller and/or the like.

The processor(s) 212, homogenous or heterogeneous, may include one or more processing nodes arranged for parallel processing, as clusters and/or as one or more multi core processor(s). The storage 214 may include one or more non-transitory memory devices, either persistent non-volatile devices, for example, a ROM device, a Flash device, a hard drive, a Solid State Drive (SSD), a magnetic disk and/or the like and/or volatile devices, for example, a RAM device, a cache memory and/or the like.

The processor(s) 212 may execute one or more software modules, for example, a process, a script, an application, an agent, a utility, a tool and/or the like each comprising a plurality of program instructions stored in a non-transitory medium such as the storage 214 and executed by one or more processors such as the processor(s) 212. For example, the processor(s) 214 may execute a massage optimizer application 220 for executing the process 100 to reduce the size of one or more of the intercepted messages.

The remote server 240, for example, a storage server, a processing node, a cluster of processing nodes and/or the like may be collect data, for example, messages intercepted in the vehicular operational environment including the reduced size messages from a plurality of optimization systems 200 deployed in a plurality of vehicles 202. The remote server 240 may further include one or more cloud computing and/or storage services and/or platforms such as, for example, Amazon Web Service (AWS), Google Cloud, Microsoft Azure and/or the like. The collected messages may be used for one or more of a plurality of application, for example, predictive maintenance, anomaly detection, forensics, fleet management and/or the like.

Figure 3:
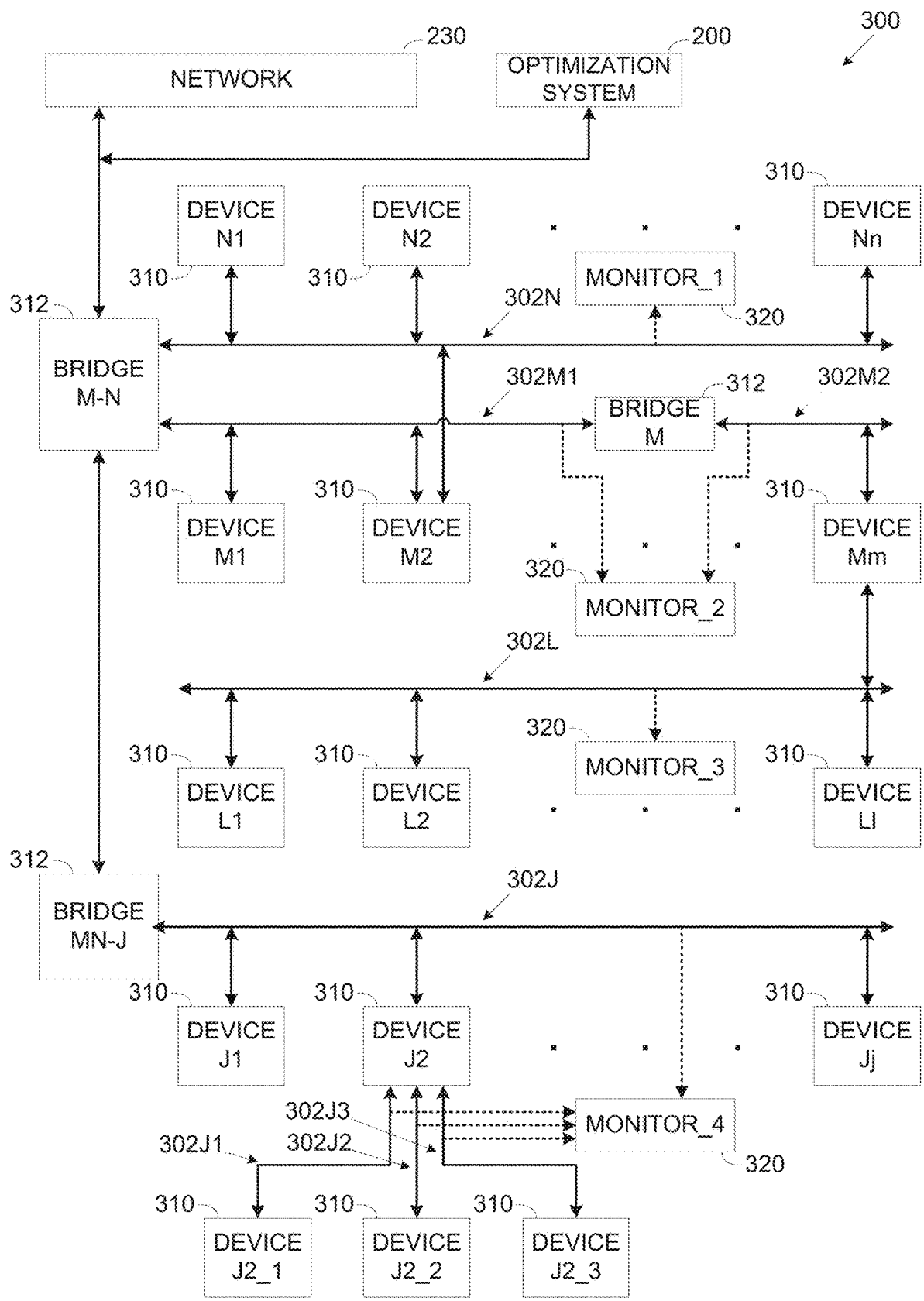
FIG. 3 is a schematic illustration of an exemplary distributed vehicular system for intercepting communication messages exchanged over communication channels of a vehicle, according to some embodiments of the present invention.

Reference is now made to FIG. 3, which is a schematic illustration of an exemplary distributed vehicular system for intercepting communication messages exchanged over communication channels of a vehicle, according to some embodiments of the present invention. An exemplary system 300 may deploy in a vehicle such as the vehicle 202 for intercepting messages exchanged between a plurality of devices 310 deployed in the vehicle 202. The devices 310 may include for example, sensor(s), ECU(s), I/O controller(s), communication controller(s) and/or the like. The topology and deployment of the system 300 is exemplary and should not be construed as limiting since multiple other deployments, topologies and/or layouts may be implemented as known in the art.

The sensors may include one or more sensors, for example, an engine operation sensor, an environmental condition sensor (e.g. temperature sensor, a light sensor, a humidity sensor, etc.), a navigation sensor (e.g. a Global Positioning System (GPS) sensor, an accelerometer, a gyroscope, etc.), an imaging sensor (e.g. a camera, a night vision camera, a thermal camera, etc.) and/or the like. The ECUs may include one or more processing units and/or controllers adapted to operated, control and/or execute one or more functions of the vehicle 202, for example, steering, accelerating, breaking, parking, information collection, safety system control, multimedia, infotainment, door control, window control and/or the like. The I/O controllers may include one or more controllers adapted to connect to one or more of the sensors, the ECUs and/or the like. The I/O controllers may include one or more controllers adapted to operate one or more user interfaces, for example, a pointing device, a keyboard, a display, an audio interface and/or the like. The communication controllers may include one or more controllers adapted to connect to the network 230. Optionally, one or more of the devices 310 may be integrated devices comprising one or more of the sensors, the ECUs, the I/O controllers, the communication controllers and/or the like.

The devices 310 may communicate with each other by sending messages over one or more wired and/or wireless (vehicle) communication channels 302 deployed in the vehicle 202, for example, CAN bus, LIN, FlexRay, LAN, Ethernet, automotive Ethernet, WLAN (e.g. Wi-Fi), WCAN, MOST and/or the like. The topology of the system may vary and may include a plurality of communication channels 302 of various types and various topologies (e.g. bus, point-to-point, multi-drop, etc.) which may be further segmented. By deploying specific types of communication channels 302 and optionally segmenting one or more of them, the topology of the system 300 may be adapted to accommodate one or more needs, constraints and/or objectives of the system 300, for example, apply segregated domain(s) for increased security to sensitive devices 310, adapt to deployment physical limitation(s) of the vehicle 202 (e.g. limited space, long distances, etc.), create a hierarchical structure(s) for at least some of the devices 310 and/or the like.

For example, one or more devices 310, for example, a device 310 N1, a device 310 N2 through device 310 Nn may connect to a communication channel 302N, for example, a LIN. In another example, one or more devices 310, for example, a device 310 M1, a device 310 M2 through device Mm may connect to a segmented communication channel 302M, for example, a CAN bus comprising two CAN bus segments 302M1 and 302M2. In another example, one or more devices 310, for example, a device 310 L1, a device 310 L2 through device 310 L1 may connect to a communication channel 302L, for example, a MOST. In another example, one or more devices 310, for example, a device 310 J1, a device 310 J2 through a device 310 Jj may connect to a communication channel 302J, for example, a Wi-Fi network.

The system 300 may further include one or more bridges 312 adapted to connect between communication channels 302 of different types and/or between segments of one or more of the communication channels 302. The bridges 312 may transfer one or more messages from one communication channel 302 to another communication channels 302 in one or both directions to allow propagation of messages between the communication channels 302. Naturally, each bridge 312 includes the appropriate interfaces and/or ports for connecting to the respective communication channels 302 it connects to. For example, a bridge 312 M-N may connect the communication channel 302N and the communication channel 302M. In another example, a bridge 312 MN-J may connect the communication channels 302N and 302M with the communication channels 302J. In another example, a bridge 312 M may connect between the segments 302M1 and 302M2 of the communication channels 302M.

One or more of the devices 310 may also serve as a bridge 312. For example, the device 310 Mm may bridge between the communication channel 302M, specifically the segment 302M2 of the communication channel 302M and the communication channel 302L. In another example, the device 310 J2 may serve as a bridge 312 for connecting a device 310 J1, a device 310 J2 and/or a device 310 J3 to the communication channel 302J where the device 310 J1 connects to the device 310 J2 through a communication channel 302J1, the device 310 J2 connects to the device 310 J2 through a communication channel 302J2 and the device 310 J3 connects to the device 310 J2 through a communication channel 302J3. The communication channels 302J1, 302J2 and/or 302J2 may be of the same type and/or of different types.

The system 300 may further include one or more monitoring devices 320 for monitoring and intercepting communication, specifically messages exchanged between the devices 310 over the communication channels 302. The monitoring devices 320 may be operatively connected to the optimization system 200, for example, via the communication channel(s) 302 and/or through dedicated communication channel for transferring the intercepted messages to the optimization system 200.

The system 300 may include a central monitor 320 which may connect to a plurality of the communication channels 302 and monitor the multitude of communication channels 302. However, the system 300 may include a plurality of monitors 320, for example, a monitor_1 which monitors the communication channel 302N, a monitor_2 which monitors the communication channel 302M specifically the segments 302M1 and 302M2, a monitor_3 which monitors the communication channel 302L, a monitor_4 which monitors the communication channel 302J and/or the like. The monitor_4 may further monitor one or more of the communication channels 302J1, 302J2 and/or 302J3. One or more of the monitors 320 may be integrated in one or more of the devices 310 and/or the bridges 312 such that in addition to its normal operation the integrated device 310 or the integrated bridge 312 may monitor and intercept messages transmitted on the respective communication channel(s) 302 it connects to.

According to some embodiments of the present invention, the monitors 320 are receive-only devices which are only capable of intercepting (receiving) the messages transmitted on the communication channel(s) 302 while unable to transmit messages or affect the communication channel(s) 302 in any way.

The monitoring device(s) 320 adapted to intercept the messages exchanged over the communication channels 302 may optionally be configured as passive receiver-only device incapable of injecting data to the communication channels 302. Furthermore the monitoring device(s) 320 may be coupled to the communication channels 302 in an isolated manner thus incapable of inducing, altering, manipulating and/or otherwise affecting the transmission signals of the communication channels 302 in any way. For example, one or more of the monitoring devices 320 may include one or more sensing wires wrapped around one or more insulated wires of one or more of the communication channels 302 such that the sensing wire(s) are incapable of injecting data, messages and/or signals to the communication channel(s) 302. By analyzing the electric load, current and/or voltage of the signals travelling (propagating) through the insulated wires of the communication channel(s) 302 as sensed by the sensing wire(s), the monitoring device(s) 320 may detect messages exchanged over the communication channel(s) 302 and intercept them. In another example, one or more of the monitoring devices 320 may include a wireless receiver-only capable of intercepting wireless messages exchanged between one or more of the devices 210 while incapable of transmitting messages.

Reference is made once again to FIG. 1 and FIG. 2.

As shown at 102, the process 100 starts with the message optimizer 220 obtaining, for example, receiving, retrieving, fetching, collecting and/or the like one or more of a plurality of messages intercepted by one or more monitoring devices such as the monitor device 320 at one or more communication channels such as the communication channels 302 and/or segments thereof.

The intercepted messages transmitted by one or more devices such as the device 310 may typically include one or more fields, for example, a message identifier (type), an originating device identifier, a destination device identifier, a time stamp, a payload size indicator, a payload, a metadata, a protocol related field, a reserved field and/or the like.

In order to temporally and/or spatially correlate the intercepted messages, time and/or space (location) attributes may be required for the intercepted messages, for example, a time stamp indicating a time of interception of the respective message, an origin communication channel 302 where the respective message is intercepted and/or the like.

Some communication protocols, for example, Transmission Control Protocol (TCP/IP) and the Internet Protocol (IP) (TCP/IP) may inherently include such time and/or space attributes. For example, in Transmission Control Protocol (TCP/IP) and the Internet Protocol (IP) (TCP/IP) each message includes a time stamp field indicating a time of transmission of the respective message. In another example, in TCP/IP and the Internet Protocol (IP) (TCP/IP) each message includes a field indicating an IP address of the originating device 310 and/or a field indicating an IP address of the destination device 310.

However, other communication protocols may not define such time and/or space attributes. In such case the monitoring device(s) 320 may extend one or more of the intercepted messages, for example, adding a metadata to the intercepted message(s) to include these time and/or space attributes, specifically, the time stamp, the origin communication channel 302 and/or the like. As part of the intercepted message, the monitoring device(s) 320 may provide the extension, for example, the metadata to the message optimizer 220. The metadata may further include additional attributes, for example, a protocol of the intercepted message (e.g. CAN, TCP/IP, LIN, etc.). For brevity the extension to the message added by the monitoring device(s) 320 is considered herein after as an additional field(s) of the intercepted message.

As shown at 104, the message optimizer 220 may apply one or more trained machine learning models, for example, a parametric machine learning model, a non-parametric machine learning model, a supervised machine learning model, an unsupervised machine learning model, a semi-supervised machine learning model and/or the like to analyze one or more of the intercepted messages in order to identify one or more data patterns. The machine learning models may include one or more machine learning probabilistic models, engines and/or algorithms, for example, a neural network, a support vector machine (SVM), a decision tree, a K-Nearest neighbors algorithm, a context tree, a graphical model, a Bayesian net, a random forest, a rotational forest, a deep learning algorithm and/or any other learning algorithm trained as known in the art. The machine learning models may further include spectral clustering, hashing, boosting and/or the like.

The data patterns may include, for example, a constant value, an incrementing value, a decrementing value, a finite range of discrete values and/or the like.

The machine learning model(s) may be trained to identify the data patterns during a training phase with a plurality of training datasets comprising training message designed, constructed and/or selected to represent the messages exchanged in the vehicle operational environment of the vehicle 202. For example, in case a CAN bus is deployed in the vehicle 202, the training datasets used to train the machine learning model(s) may include CAN bus messages. In another example, assuming, one of the devices 310 is a temperature sensor, the training datasets used to train the machine learning model(s) may include messages generated by one or more such temperature sensors and/or simulated to represent messages generated by such temperature sensor(s).

The machine learning model(s) used by the message optimizer 220 may be trained with suitable training datasets designed, constructed and/or selected according to the type of the machine learning model as known in the art. For example, a supervised machine learning model may be trained with a plurality of annotated (labeled) training datasets each labeled with a class label associated with a respective one of a plurality of data patterns, specifically, data patterns associated with fields of the training messages. In another example, a non-parametric unsupervised machine learning model may be trained with a plurality of training datasets which are not annotated. In this case, the unsupervised machine learning model may cluster the training datasets to clusters according to the values and/or patterns identified in the intercepted messages and learned over time.

During the training phase the machine learning model(s) is trained to identify, i.e. cluster, classify, map and/or the like one or more data patterns in the intercepted messages. In particular, the machine learning model(s) may be trained to identify the data patterns in the fields of the intercepted messages, for example, the message identifier, the originating device identifier, the destination device identifier, the time stamp, the payload size indicator, the payload, the metadata, the protocol related field and/or the like.

For example, applying the trained machine learning model(s), the message optimizer 220 may detect a certain field of a certain intercepted message(s) is a message identifier. The message optimizer 220 may further identify one or more constant data patterns in the message identifier field of one or more intercepted messages which identify, for example, a type of the intercepted message (e.g. in the CAN bus protocol), a protocol of the intercepted message (e.g. CAN, TCP/IP, MOST, etc.) an index of the intercepted message and/or the like. The identified data patterns may therefore correspond, for example, to the type of messages transmitted over a certain CAN bus communication channel 302.

In another example, applying the trained machine learning model(s), the message optimizer 220 may detect a certain field of certain intercepted message(s) is an originating device identifier. For example, in Transmission Control Protocol (TCP) and the Internet Protocol (IP) (TCP/IP), each message includes a field indicating an IP address of the originating device 310. The message optimizer 220 may further identify one or more data patterns in the originating device IP address field of one or more intercepted messages. The identified data patterns may therefore correspond, for example, to the IP addresses of the devices 310 transmitting TCP/IP messages. In another example, in TCP/IP, each message includes a field indicating an IP address of the destination device 310. The message optimizer 220 may further identify one or more data patterns in the destination device IP address field of one or more intercepted messages. The identified data patterns may therefore correspond, for example, to the IP addresses of the devices 310 receiving TCP/IP messages.

In another example, applying the trained machine learning model(s), the message optimizer 220 may detect a certain field of certain intercepted message(s) is a time stamp of the intercepted message(s). As described herein before, the time stamp filed may be available in messages utilizing one or more communication protocols, for example, TCP/IP and/or the like. Additionally and/or alternatively as described herein before, the time stamp field may be included in the metadata field or part thereof if added by the monitoring device(s) 320. For example, the message optimizer 220 may identify incrementing or decrementing data pattern(s) in a certain field of a plurality of intercepted messages and may therefore determine that the certain field is the time stamp field of the intercepted messages. The identified data patterns may therefore correspond, for example, to timing values indicating timing (e.g. time, data, etc.) of transmission and/or of interception of the respective intercepted message(s).

In another example, applying the trained machine learning model(s), the message optimizer 220 may detect a certain field of certain intercepted message(s) is a payload of the intercepted message(s). For example, the message optimizer 220 may identify one or more sets of finite values (e.g. a set, a range, etc.) in a certain field of a plurality of intercepted messages and may therefore determine that the certain field is the payload of the intercepted messages. The identified data patterns may correspond, for example, to a set and/or a range of status data values transmitted by one or more of the devices 310 such as for example, a range of sensor reading values, a set operational status values and/or the like. In another example, the identified data patterns may correspond, for example, to a set and/or a range of control data values transmitted by one or more of the devices 310 such as for example, a set of command codes, a set of instructions values and/or the like.

In another example, applying the trained machine learning model(s), the message optimizer 220 may detect one or more fields of certain intercepted message(s) is a protocol related and/or reserved fields, for example, a flag, a field, a code and/or the like. For example, in the CAN bus protocol one or more fields in a message are reserved. In another example, one or more fields of the messages may be used by one or more of the communication protocols for controlling message flow, for example, arbitration, handshake, acknowledge, priority and/or the like. For example, in the CAN bus protocol, a certain bit field in each CAN message is an acknowledge delimiter field. In another example, in the CAN bus protocol, a certain bit field at the end of each CAN message is an End of Message (EOF) indication field.

Optionally, the machine learning model(s) is trained for sub-message analysis to identify one or more of the data patterns in a portion (part) of one or more of the fields of the intercepted messages, in particular a portion (segment) of the payload.

The payload of one or more of the messages exchanged over the communication channel(s) 302 may include multiple functional data segments where each of the data segments relates to a different function, operation, device 310 and/or the like. Similarly to the payload fields, the functional data segments of the payload may include various types of data, for example, constant data, a set of discrete values (or range), a counter value (incrementing or decrementing), an uncontrolled value and/or the like. For example, a certain payload of a certain message may include sensor reading values obtained from a plurality of sensors such that the value of each of the sensors is encoded with a set of bit(s) in a separate segment of the certain payload.

The machine learning model(s) may therefore be trained to evaluate entropy of the payload of one or more of the messages to identify the multiple data segments in the payload and further identify one or more patterns in the data segments. Applying the trained machine learning model(s), the message optimizer 220 may thus detect the functional data segments in the payload of one or more of the intercepted messages.

As shown at 106, the message optimizer 220 may adjust one or more of the intercepted messages by replacing one or more data patterns identified in a certain intercepted message with a reduced size representation of the data pattern. The reduced size representation may be predefined such that each of a plurality of data pattern learned during the training phase exclusively corresponds (one-to-one) to a respective reduced size representation of the data pattern. Moreover, the message optimizer 220 may adjust the intercepted message(s) by replacing data patterns identified in the learned fields of the intercepted messages, for example, the message identifier (type), the originating device identifier, the destination device identifier, the time stamp, the payload size indicator, the payload and/or part thereof, the metadata, the protocol related field and/or the like.

The reduced size representation of the data pattern may be lossless such that all the data of the data pattern may be extracted from the respective reduced size representation with no data loss and/or ambiguity.

The reduced size representations of the detected data patterns are mapped in a dataset, for example, a list, a table, a database and/or the like comprising a plurality of entries each associating one of the learned data patterns with a respective one of a plurality of predefined reduced size representations. The dataset may be maintained by both the optimization system 200 thus available to the message optimizer 220 and by the remote server 240. Moreover, the reduced size representations may be implemented as indices in the dataset such that each of the reduced size representations points to the entry holding its respective data pattern in the dataset. Having access to the dataset, both the message optimizer 220 and the remote server 240 may be able to correctly encode and decode the predefined reduced size representation(s) to extract the respective original data pattern(s) replaced by the message optimizer 220 with the predefined reduced size representation(s).

Continuing the previously presented examples, assuming the message optimizer 220 identifies a plurality of data patterns corresponding to a plurality of message identifiers (e.g. message types in the CAN protocol, protocol types, etc.) detected in a message identifier field of a plurality of intercepted messages. Typically the message identifier field may be significantly large, for example, 10 bits to support encoding a high number of message types, for example, 1024. However the number of message types actually exchanged in a specific environment of a certain vehicle 202, i.e. over the communication channel(s) 302 may be significantly smaller, for example, 16. The message identifier field may therefore be significantly reduced, for example, to 4 bits since only a subset (16) of the message types needs to be encoded. In such case, the message optimizer 220 may replace the original 10-bit message type codes (data patterns) with a predefined significantly reduced size 4-bit code (representation) to map the 16 message types. However, as described, the predefined codes are defined such that they are sufficient for distinguishing between the message types detected at the certain vehicle 202, i.e. lossless representation of the original message type.

In another example, assuming the message optimizer 220 identifies a plurality of data patterns corresponding to a plurality of originating device identifiers detected in a message originating device identifier field of a plurality of intercepted messages. Typically the originating device identifier field may be significantly large to support encoding a high number of originating devices 310 deployed in the vehicle 202 and transmitting messages over the communication channel(s) 302. However the number of originating devices 310 actually deployed in the vehicle 202 and capable of transmitting messages may be significantly smaller. The originating device identifier field may therefore be significantly reduced to support encoding only the originating devices 310 actually deployed in the vehicle 202. For example, assuming the size of the originating device identifier field is 16 bits to map 64K originating devices. However, the actual number of devices 310 deployed in the vehicle 202 may be much lower, for example, 200. In such case the message optimizer 220 may replace the original 16-bit originating device identifier codes (data patterns) with a predefined significantly reduced size 8-bit code (representation) to map the 200 devices 310.

In another example, assuming the message optimizer 220 identifies a plurality of data patterns corresponding to one or more sets and/or finite ranges of values detected in a payload field and/or part thereof of a plurality of intercepted messages. The size of the payload may be significantly large to support encoding a high number of values of the set(s) and/or range(s). However the number of values possible for the set(s) and/or range(s) may be significantly smaller. The payload field and/or one or more of its parts may therefore be significantly reduced to support encoding only the values relevant for the operational environment of the vehicle 202. For example, assuming the size of the payload is 2 bytes to map a sensor reading range of 64K values of for a certain sensor 310. However, the actual reading range the certain sensor 310 is actually capable of may be significantly smaller, for example, 512 values. In such case the message optimizer 220 may replace the original 2-byte values (data patterns) with a predefined significantly reduced size 9-bit code (representation) to map the range of 512 values captured by the certain sensor 310.

In another example, assuming the message optimizer 220 identifies one or more data patterns corresponding to one or more protocol related and/or reserved fields. In such case the message optimizer 220 may optionally remove one or more of the protocol related and/or reserved fields. For example, in the CAN bus protocol, the message optimizer 220 may remove the acknowledge delimiter field and/or the EOF indication field in the reduced size message(s).

Moreover, assuming the message optimizer 220 identifies an incrementing or decrementing data pattern corresponding to a time stamp, a counter, a timer and/or the like field of a plurality of intercepted messages. The time stamp defined by one or more of the protocols used by at least some of the devices 310 deployed in the vehicle 202 may be significantly large, for example, 64 bits (8 bytes) to express an absolute high resolution timing, for example, a date, a day of week, a time including fractions of time (e.g. hours, minutes, seconds, milliseconds, microseconds, nanoseconds, etc.) and/or the like. However, the transmission rate of one or more of intercepted message via the communication channel(s) 302 may be significantly low resulting in a significantly high transmission time of the intercepted message(s). The high resolution time stamp expressing, for example, the microseconds and/or the nanoseconds may be irrelevant and/or of no benefit due to the significantly lower transmission rate. For example, assuming one of the communication channel 302 is a CAN bus operating at 256 Kbit per second. A 20-byte message (containing an 8-byte payload) transmitted by one of the devices 310 the CAN bus may take approximately 625 milliseconds. The message optimizer 220 may therefore replace the high resolution time stamp with a reduced size representation comprising a time stamp having a size of, for example, 2 bytes in which the milliseconds field is maintained and the microseconds and/or the nanoseconds fields are discarded (i.e. removed, deleted).

Furthermore, the message optimizer 220 may replace an absolute time stamp detected by its incrementing or decrementing data pattern in a plurality intercepted messages with a relative time stamp expressing the time stamp of a current message with respect to the time stamp of one or more previously intercepted messages. For example, the message optimizer 220 may maintain lower resolution segment(s) of the time stamp such as the date, day of week, hour and/or the like in an intercepted message once every predefined period, for example, once an hour. The message optimizer 220 may maintain may maintain the next higher resolution segment(s) of the time stamp, for example, the minute count and/or the seconds count in an intercepted message once every second. The message optimizer 220 may adjust the rest of the intercepted messages to include the relative time maintaining, for example, only millisecond from the most recent periodically maintained intercepted messages. As such the reduced size representation of the relative time stamp of most of the adjusted messages may be significantly reduced compared to the absolute time stamp.

Replacing the data pattern(s) with their respective predefined reduced size representation(s) may in turn significantly reduce a size of the intercepted message(s) thus the adjusted messages may be significantly smaller in size compared to the respective intercepted messages.

As shown at 108, the message optimizer 220 may output the adjusted message(s). For example, the message optimizer 220 may transmit (upload) the adjusted intercepted message(s) to the remote server 240. The bandwidth required for transmitting (uploading) the adjusted (reduced size) messages from the optimization system 200 at the vehicle 202 to the remote server 240 may be significantly lower than the bandwidth required for transmitting the originally intercepted messages.

The remote server 240 may process the received adjusted message(s) to recover, for example, restore, reconstruct, decode, extract and/or the like the originally intercepted message(s) before further analyzing the message(s). The remote server 240 may apply one or more analyses on the restored intercepted message(s) for one or more of a plurality of applications, for example, predictive maintenance, anomaly detection, forensics, fleet management and/or the like.

Additionally and/or alternatively, the message optimizer 220 locally stores one or more of the adjusted (reduced size) messages, for example, in the storage 214. The locally stored adjusted messages may be later locally analyzed at the vehicle 202 and/or uploaded (transmitted to the remote server 240 at a later time, for example, while the vehicle 202 is parked. The storage resources (e.g. capacity, etc.) required for storing the adjusted messages at the vehicle 202 may be significantly lower than the storage resources required for storing the originally intercepted messages.

It is expected that during the life of a patent maturing from this application many relevant systems, methods and computer programs will be developed and the scope of the terms machine learning models and/or vehicle communication channels are intended to include all such new technologies a priori.

As used herein the term "about" refers to ±10%.

The terms "comprises", "comprising", "includes", "including", "having" and their conjugates mean "including but not limited to".

The term "consisting of" means "including and limited to".

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

In addition, any priority document(s) of this application is/are hereby incorporated herein by reference in its/their entirety.

What is claimed is:

1. A computer implemented method of reducing size of intercepted messages transmitted via at least one wired communication channel of a vehicle, comprising:
using at least one processor of a vehicular device, the at least one processor is adapted for:
receiving at least one of a plurality of messages intercepted by at least one device adapted to monitor messages transmitted via at least one wired communication channel of a vehicle, the at least one device is a passive receiver-only device adapted to monitor the messages transmitted while incapable of altering transmission signals of the at least one wired communication channel;
applying at least one trained machine learning model to identify at least one of a plurality of data patterns in the at least one message;
adjusting the at least one message by replacing the at least one identified data pattern with a respective predefined lossless representation having a reduced size compared to the at least one identified data pattern, wherein the identified data pattern includes a time stamp indicating a timing of transmission of the at least one message, and wherein the time stamp is adjusted according to a transmission time of the at least one message; and
transmitting the at least one adjusted message to a remote system via at least one upload communication channel,
wherein the at least one machine learning model is trained with a plurality of training messages to identify the at least one data pattern in at least one field of the at least one message, the at least one field is a member of a group consisting of: a message identifier, an originating device identifier, a destination device identifier, the time stamp, a payload size indicator, a payload, a metadata and a protocol related field.

2. The computer implemented method of claim 1, wherein the at least one data pattern is a member of a group consisting of: a constant value, an incrementing value, a decrementing value and a finite range of discrete values.

3. The computer implemented method of claim 1, wherein the at least one machine learning model is trained to identify the at least one data pattern in at least one portion of the payload.

4. The computer implemented method of claim 1, wherein the reduced size value is an index mapping the at least one identified data pattern in a dataset associating between each of the plurality of data patterns and a respective reduced size value.

5. The computer implemented method of claim 1, wherein the reduced size value further includes an adjusted field corresponding to a data pattern of one of a plurality of fields identified in the at least one message, wherein each of the plurality of fields is a member of a group consisting of: a message identifier, an originating device identifier, a destination device identifier, a payload size indicator, a payload, a metadata and a protocol related field.

6. The computer implemented method of claim 1, wherein the reduced size value corresponds to a data pattern identified in at least a portion of the payload.

7. The computer implemented method of claim 1, further comprising discarding at least one data pattern corresponding to the protocol related field identified in the at least one message.

8. The computer implemented method of claim 1, wherein the time stamp is adjusted to include a relative timing compared to at least one previous message.

9. A system for reducing size of a intercepted messages transmitted via at least one wired communication channel of a vehicle, comprising:
a program store storing a code; and
at least one processor of a vehicular device coupled to the program store for executing the stored code, the code comprising:
code instructions to receive at least one of a plurality of messages intercepted by at least one device adapted to monitor messages transmitted via at least one wired communication channel of a vehicle, the at least one device is a passive receiver-only device adapted to monitor the messages transmitted while incapable of altering transmission signals of the at least one wired communication channel;
code instructions to apply at least one trained machine learning model to identify at least one of a plurality of data patterns in the at least one message,
code instructions to adjust the at least one message by replacing the at least one identified data pattern with a respective predefined lossless representation having a reduced size compared to the at least one identified data pattern, wherein the at least one identified data pattern includes a time stamp indicating a timing of transmission of the at least one message, and wherein the adjusted time stamp is adjusted according to a transmission time of the at least one message; and
code instructions to transmit the at least one adjusted message to a remote system via at least one upload communication channel,
wherein the at least one machine learning model is trained with a plurality of training messages to identify the at least one data pattern in at least one field of the at least one message, the at least one field is a member of a group consisting of: a message identifier, an originating device identifier, a destination device identifier, the time stamp, a payload size indicator, a payload, a metadata and a protocol related field.

10. The computer implemented method of claim 1, wherein the receiver-only is configured to monitor the messages transmitted using at least one sensing wire wrapped around at least one transmission wire of the at least one wired communication channel.

11. The computer implemented method of claim 1, wherein the time stamp is adjusted to include a lower resolution.

* * * * *